(12) United States Patent
Vincent

(10) Patent No.: US 8,569,801 B2
(45) Date of Patent: Oct. 29, 2013

(54) THREE-DIMENSIONAL CMOS CIRCUIT ON TWO OFFSET SUBSTRATES AND METHOD FOR MAKING SAME

(75) Inventor: Benjamin Vincent, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 156 days.

(21) Appl. No.: 13/059,483

(22) PCT Filed: Aug. 10, 2009

(86) PCT No.: PCT/EP2009/005795
§ 371 (c)(1),
(2), (4) Date: Feb. 17, 2011

(87) PCT Pub. No.: WO2010/022856
PCT Pub. Date: Mar. 4, 2010

(65) Prior Publication Data
US 2011/0140178 A1   Jun. 16, 2011

(30) Foreign Application Priority Data
Aug. 26, 2008  (FR) ..................... 08 04689

(51) Int. Cl.
*H01L 27/092* (2006.01)
*H01L 21/336* (2006.01)

(52) U.S. Cl.
USPC ........... 257/206; 257/202; 257/204; 257/255; 257/627; 257/E27.064; 438/150; 438/154; 438/275; 438/455

(58) Field of Classification Search
USPC ........................................... 257/255
See application file for complete search history.

(56) References Cited

U.S. PATENT DOCUMENTS

| | | | |
|---|---|---|---|
| 5,317,175 A * | 5/1994 | Throngnumchai | 257/255 |
| 5,384,473 A * | 1/1995 | Yoshikawa et al. | 257/255 |
| 6,087,679 A | 7/2000 | Yamazaki et al. | |
| 6,180,496 B1 | 1/2001 | Farrens et al. | |
| 7,449,374 B2 * | 11/2008 | Hierlemann et al. | 438/150 |
| 7,566,936 B2 * | 7/2009 | Ohmi et al. | 257/369 |
| 7,675,091 B2 * | 3/2010 | Park et al. | 257/204 |
| 7,759,179 B2 * | 7/2010 | Anderson et al. | 438/154 |
| 2004/0075141 A1 | 4/2004 | Maeda et al. | |
| 2004/0119100 A1 * | 6/2004 | Nowak et al. | 257/204 |
| 2005/0280121 A1 * | 12/2005 | Doris et al. | 257/629 |

(Continued)

OTHER PUBLICATIONS

Batude et al., "3D COMS Integration; Introduction of Dynamic coupling and Application to Compact and Robust 4T SRAM," Integrated Circuit Design and Technology and Tutorial, ICICDT 2008, Jun. 2, 2008, pp. 281-284.

(Continued)

*Primary Examiner* — Cheung Lee
*Assistant Examiner* — William Harriston
(74) *Attorney, Agent, or Firm* — Oliff & Berridge, PLC

(57) ABSTRACT

A three-dimensional CMOS circuit having at least a first N-conductivity field-effect transistor and a second P-conductivity field-effect transistor respectively formed on first and second crystalline substrates. The first field-effect transistor is oriented, in the first substrate, with a first secondary crystallographic orientation. The second field-effect transistor is oriented, in the second substrate, with a second secondary crystallographic orientation. The orientations of the first and second transistors form a different angle from the angle formed, in one of the substrates, by the first and second secondary crystallographic directions. The first and second substrates are assembled vertically.

8 Claims, 2 Drawing Sheets

(56) References Cited

U.S. PATENT DOCUMENTS

| | | | |
|---|---|---|---|
| 2006/0094175 A1 | 5/2006 | Cohen et al. | |
| 2007/0145367 A1* | 6/2007 | Chen et al. | 257/49 |
| 2007/0170471 A1 | 7/2007 | Joly et al. | |
| 2007/0252144 A1* | 11/2007 | Peidous et al. | 257/57 |
| 2007/0257322 A1 | 11/2007 | Shi et al. | |
| 2007/0281446 A1* | 12/2007 | Winstead et al. | 438/478 |
| 2008/0020515 A1* | 1/2008 | White et al. | 438/118 |
| 2008/0081403 A1* | 4/2008 | Gehring et al. | 438/187 |
| 2008/0258254 A1* | 10/2008 | Boeuf | 257/510 |
| 2009/0095988 A1* | 4/2009 | Rost | 257/255 |
| 2009/0218603 A1* | 9/2009 | Brask et al. | 257/255 |
| 2010/0044758 A1* | 2/2010 | Cohen et al. | 257/255 |
| 2011/0012176 A1* | 1/2011 | Chidambarrao et al. | 257/255 |
| 2011/0140178 A1* | 6/2011 | Vincent | 257/255 |
| 2012/0032237 A1* | 2/2012 | Brask et al. | 257/255 |

OTHER PUBLICATIONS

International Search Report issued in PCT/EP2009/005795, mailed Nov. 11, 2009. (with English-language translation).

* cited by examiner

RELATED ART

THREE-DIMENSIONAL CMOS CIRCUIT ON TWO OFFSET SUBSTRATES AND METHOD FOR MAKING SAME

BACKGROUND OF THE INVENTION

The invention relates to a three-dimensional CMOS circuit comprising at least first field-effect transistors of a first conductivity type and second field-effect transistors of a second conductivity type respectively formed on first and second crystalline substrates, the first and second substrates being assembled vertically.

The invention also relates to a method for three-dimensional co-integration of a CMOS circuit successively comprising production of first field-effect transistors of a first conductivity type on a first substrate, bonding of a second substrate covering the first transistors and production of second field-effect transistors of a second conductivity type on the second substrate.

STATE OF THE ART

Seeking to achieve rapidity in C-MOS integrated circuits implies a reduction of the transistor switching times and of the propagation delays in the circuit interconnections.

Reduced switching times can be obtained by reducing the length of the transistor channels and by increasing the mobility of each of the carriers in the semiconductor material. Numerous studies are being carried out to obtain an improvement for the electrons and for the holes by means of the same material or by means of the same stress field. However, this approach reveals to be very limited in its application as the gain in mobility is not sufficient for both types of carriers at the same time. It is then advantageous to use two semiconductor layers which each present a greatly enhanced mobility respectively for electrons and for holes.

The document US 2007/0170471 describes production of a CMOS circuit which comprises NMOS and PMOS transistors each formed on a specific substrate. As illustrated in FIG. 1, first field-effect transistors 1 are formed on a first substrate 2. These first transistors 1 are formed in conventional manner on a first silicon substrate of (100) orientation, i.e. the surface of the silicon on which first transistors 1 are formed is a crystalline plane of (100) type. As illustrated in FIG. 2 by a top view, a dielectric material is then deposited on first field-effect transistors 1 and a second substrate 3, a germanium substrate with a surface of (110) type, is formed above first substrate 2 on the dielectric material. Second field-effect transistors 5 are formed on second substrate 3. The semiconductor materials forming first 2 and second 3 substrates are chosen such as to give an excellent mobility for each type of field-effect transistor. As illustrated in FIG. 3, first 1 and second 4 transistors are oriented orthogonally to one another.

However, this integration is complex and costly as the integrated circuit is not very compact and it is necessary to work with different substrates which is delicate to manage in a production line.

OBJECT OF THE INVENTION

The object of the invention is to provide a circuit that is easy to produce, is compact, economical and presents high-speed devices.

The circuit according to the invention is characterized by the appended claims and more particularly by the fact that the first field-effect transistors being oriented in a first secondary crystallographic direction in the first substrate, and the second field-effect transistors being oriented in a second secondary crystallographic direction in the second substrate, the orientations of the first and second transistors make a different angle from the angle formed in one of the substrates by said first and second secondary crystallographic directions.

The method according to the invention is characterized in that the first and second substrates each presenting a main crystallographic direction, the first and second transistors are respectively produced along first and second secondary crystallographic directions, and in that said main crystallographic directions of the first and second substrates are offset before bonding.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
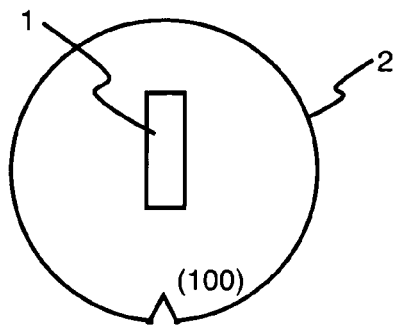
FIGS. 1 to 3 schematically represent the steps of an integration method according to the prior art in top view, FIGS. 4 to 6 schematically represent the steps of an integration method according to the invention in top view.
Figure 2:
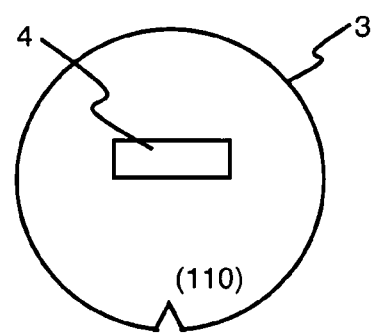
Figure 3:
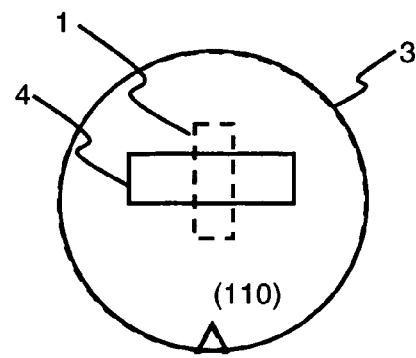
Figure 4:
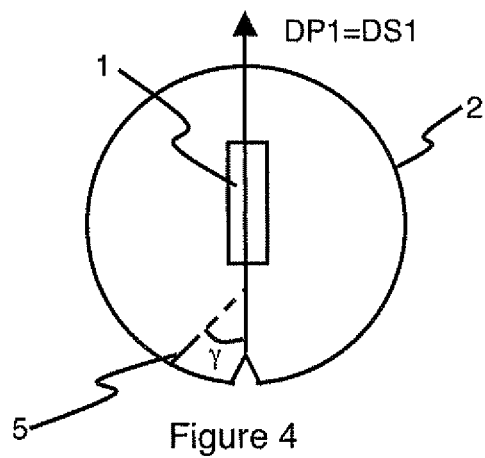

As illustrated in FIG. 4, first field-effect transistors 1 are produced on a first crystalline substrate 2 which comprises a main crystallographic direction DP1. First transistors 1 are oriented along a first secondary crystallographic direction DS1. This orientation can be materialized by the longitudinal axis of the gate electrode or by the axis joining the source and drain of the transistor.

in conventional manner, the main crystallographic direction of a crystalline substrate is materialized by a notch or by a flat. Conventionally in microelectronics, the main crystallographic direction is the <110> direction. However crystalline substrates also exist which have a main crystallographic direction of <100> type or another direction.

The surface of first substrate 2 is furthermore a plane which is advantageous for the electronic characteristics of first transistors 1. The surface of first substrate 2 can for example be a (100) plane or a (110) plane.

The notch or flat which materializes main crystallographic direction DP1 is conventionally used by all microelectronics industry equipment to align the substrates, in particular by photolithography equipment, to achieve, precise alignment of the transistors along the main crystallographic direction of the substrate. Almost all of the integrated circuit production is made on silicon crystal substrates which present a surface of (100) type and a main crystallographic orientation of <110> type. These substrates are therefore very inexpensive compared with substrates with other main crystallographic orientations or other surface planes.

A dielectric material is then deposited on first substrate 2 and covers first field-effect transistors 1. Advantageously, if the dielectric material is not flat after deposition, a planarizing step can be performed, for example by chemical mechanical polishing.

Figure 5:
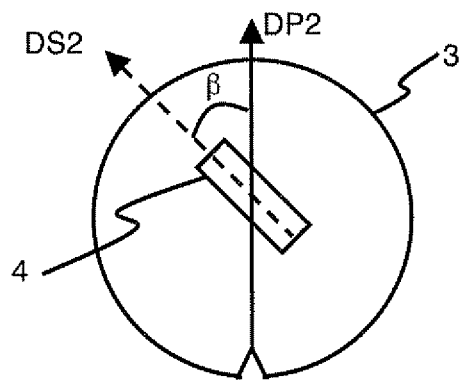

As illustrated in FIG. 5, a second substrate 3 is then formed above first substrate 2 on the dielectric material layer. This second substrate 3 also comprises a main crystallographic direction DP2 which can be identical or not to that of first substrate DP1. As for first substrate 2, main crystallographic direction DP2 of second substrate 3 is materialized by a notch or a flat. The first and second substrates can thus have the same main crystallographic direction, for example of <110> type, or two main crystallographic directions, for example respectively of <110> and <100> type.

Formation of second substrate 3 on first substrate 2 is performed by any suitable technique, for example by molecular bonding by means of an intermediate layer of oxide or of another dielectric material. Before bonding, second substrate 3 is offset with respect to first substrate 2 by a predefined angle. This predefined offset corresponds to a first angular offset γ which exists between main crystallographic directions DP1 and DP2 of first 2 and second 3 substrates.

Advantageously, to define first angular offset γ between first substrate 2 and second substrate 3 precisely, a mark 5 is made on first substrate 2, for example by means of a laser (FIG. 4). This mark 5 represents first angular offset γ with respect to main crystallographic direction DP1 of first substrate 2 and is used for alignment of second substrate 3, for example with its notch.

First angular offset γ of substrates 2 and 3 is chosen such that the orientations of first 1 and second 4 transistors is equal to a predefined angle α. In other words, first angular offset γ of substrates 2 and 3 is chosen such that the longitudinal axes of the gates of first 1 and second 4 transistors form an angle α between them.

Once second substrate 3 has been formed and offset by first predefined angle γ, second field-effect transistors 4 are formed (FIG. 5). These second field-effect transistors 4 are of opposite type to that of the first transistors. The first and second transistors respectively of a first and second conductivity type form a CMOS circuit.

In the present case, first field-effect transistors 1 are of N-conductivity type and second transistors 4 are of P-conductivity type. They therefore respectively use electrons and holes as charge carriers.

Advantageously, for first field-effect transistors 1, first secondary crystallographic direction DS1 is identical to main crystallographic direction DP1. First transistors 1 are therefore oriented along a crystallographic direction of <110> type. This crystallographic direction is commonly used in the microelectronics industry and provides a good electron mobility. These first transistors are produced in conventional manner by means of conventional microelectronics industry techniques. The lattice of silicon, germanium and silicon-germanium alloys in the relaxed state being cubic, the <110> crystallographic direction groups nine equivalent directions and their opposites, for example directions [110], [101] and [011].

Second transistors 4 being of P-conductivity type, they are advantageously oriented along a secondary crystallographic direction DS2 which is of <100> type, i.e. they are offset with respect to main crystallographic direction DP2 of second substrate 3. Main crystallographic direction DP2 of second substrate is in fact not necessarily optimal for the mobility of holes which are used as charge carriers in second transistors 4. Second transistors 4 are therefore formed along another crystallographic direction which is more favorable to the charge carriers used, for example here a [100] crystallographic direction.

It is however possible to use a different crystallographic direction, for example a crystallographic direction of <111> or <210> type. It is also possible to use the same secondary crystallographic direction DS2 as for the first transistors. In this case, first DS1 and second DS2 secondary crystallographic directions are identical.

In general manner, second transistors 4 are oriented along a secondary crystallographic direction DS2 which presents a second angular offset β with respect to main crystallographic direction DP2 of second substrate 3 (FIG. 5).

First 2 and second 3 substrates being arranged vertically, to improve the compactness of the structure, first 1 and second 4 transistors are formed underneath one another with a slight offset. To reduce the surface of the circuit, it is in fact advantageous for the overlap surface of first 1 and second 4 transistors to be as large as possible. Complete or almost complete overlap must however be avoided to enable easy contacting of the electrodes of each transistor. Advantageously, if source and/or drain areas of two complementary transistors have to be connected to one another, these two areas share a sufficiently large surface for formation of a common contact plug. The angle α which exists between the orientations of first 1 and second 4 transistors corresponds to the difference between angular offset γ which exists between the first and second substrates and angular offset β which exists between main crystallographic direction DP2 and secondary crystallographic direction DS2 in second substrate 3. The orientations of the first and second transistors form an angle α, and by adjusting this angle α a more compact CMOS circuit can be obtained than with transistors oriented as in the prior art.

Figure 6:
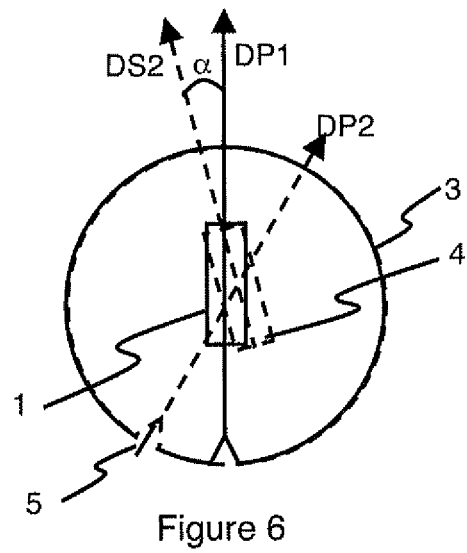

Thus, as illustrated in FIG. 6, when bonding of second substrate 3 to first substrate 2 is performed, first angular offset γ between the two main crystallographic directions DP1 and DP2 is chosen such that the orientations of the first and second transistors form the angle α between them. The orientation of second transistor 4 with respect to main crystallographic direction DP2 in the second substrate is in fact predefined and known before second substrate 3 is bonded to first substrate 1. Angular offset β between main direction DP2 and secondary direction DS2 in second substrate 3 is therefore taken into account when bonding is performed.

This results, in the CMOS circuit, in the angle α, between the orientations of the first and second transistors, i.e. the angle α that exists between first secondary crystallographic direction DS1 in the first substrate and second secondary crystallographic direction DS2 in the second substrate, being different from the angle formed by the first and second secondary crystallographic directions in each of the substrates, in the first substrate and in the second substrate. Advantageously, to gain compactness, the orientations of the first and second transistors form a smaller angle than the angle formed by the first and second secondary crystallographic directions. This difference of angle stems from the offset γ that is created between first 2 and second 3 substrates. For example if first transistors 1 are oriented along a direction [110] and second transistors 4 are oriented along a direction [100], the angle formed by the directions [110] and [100] is equal to 45° in the first and second substrates. By introducing an angular offset between first 2 and second 3 substrates equal to 35°, the orientation of first 1 and second 4 transistors then forms an angle equal to 10° which is different from and smaller than that formed by the directions [110] and [100] in each of the substrates.

In general manner, if the first transistors are oriented along the main direction of the first substrate, the angle α between the orientations of first 1 and second 4 transistors is equal to the difference between the first angular offset γ that is created between the first and second substrates and the second angular offset β that exists between main DP2 and secondary DS2 crystallographic directions of second substrate 3, i.e. α=γ−β.

If first 1 and second 4 transistors are both oriented along the main crystallographic directions of first 2 and second 3 substrates, the angle α between the orientations of the first and second transistors is therefore equal to the first angular offset γ that exists between the two substrates 2 and 3.

In other words, the angular offset between first 1 and second 4 transistors is represented by the angle α that represents the angular difference that exists between crystallographic directions DS1 and DS2 along which first 1 and second 4 transistors are integrated on their respective substrates. The angle α represents the difference between the first angular offset γ of main crystallographic directions DP1 and DP2 of first 2 and second 3 substrates and the second angular offset 13 of second transistors 4 with respect to main crystallographic direction DP2 of second substrate 3. To gain compactness, the angle α is advantageously comprised in the ]0, 90[ range in which the angles 0 and 90° are excluded.

It is possible by means of this method to form a three-dimensional CMOS circuit each type of transistor of which is formed independently along a crystallographic direction proper which corresponds to the crystallographic direction of each of the substrates on which the transistors are integrated. In this way, first transistors 1 are oriented in a first secondary crystallographic direction DS1 which is the main crystallographic direction DP1 of first substrate 2 and second transistors 4 are aligned in a second secondary crystallographic direction DS2 which can be different from main crystallographic direction DP2 and the angle between the orientations of first 1 and second 4 transistors is adjusted by means of the offset of the two substrates with respect to one another.

Thus, in a particular embodiment, the angle α made by the orientations of the first and second transistors is defined to obtain the best compactness of the circuit. The secondary crystallographic directions providing optimal mobilities for the first and second transistors being known, the main crystallographic directions of the first and second substrates are then offset by a predefined angle which takes the desired angle α and the existing angles for each of the substrates between the main and secondary crystallographic directions into account.

The invention claimed is:

1. A three-dimensional CMOS circuit including:
   a first crystalline substrate;
   a second crystalline substrate disposed overlapping the first crystalline substrate;
   a first field-effect transistor of a first conductivity type formed on the first crystalline substrate, the first field-effect transistor presenting a first source-drain axis oriented in a first secondary crystallographic direction of the first crystalline substrate;
   a second field-effect transistor of a second conductivity type formed on the second crystalline substrate, the second field-effect transistor presenting a second source-drain axis oriented in a second secondary crystallographic direction of the second crystalline substrate,
   wherein:
   the first source-drain axis and the second source-drain axis form a first angle different from a second angle formed, in the first substrate, by the first secondary crystallographic direction and the second secondary crystallographic direction, and
   the first angle is in a ]0, 90[ range.

2. The circuit according to claim 1, wherein the first angle is smaller angle than the second angle.

3. The circuit according to claim 1, wherein the first secondary crystallographic direction and the second secondary crystallographic direction are identical.

4. The circuit according to claim 1, wherein the first secondary crystallographic direction is <110> type.

5. The circuit according to claim 1, wherein the second secondary crystallographic direction is <100> type.

6. A method for three-dimensional co-integration of a CMOS circuit successively comprising:
   providing a first crystalline substrate with a first main crystallographic direction, the first crystalline substrate comprising first field-effect transistors, the first field-effect transistor presenting a first source-drain axis oriented in a first secondary crystallographic direction of the first substrate;
   providing a second crystalline substrate with a second main crystallographic direction;
   covering the first crystalline substrate with the second crystalline substrate, the first field-effect transistors being disposed between the first crystalline substrate and the second crystalline substrate, the first main crystallographic direction and the second main crystallographic direction being offset before covering; and
   forming a second field-effect transistor on the second crystalline substrate, the second field-effect transistor presenting a second source-drain axis oriented in a second secondary crystallographic direction of the second crystalline substrate,
   wherein an angle between the first source-drain axis and the second source-drain axis is in a ]0, 90[ range.

7. The method according to claim 6, wherein the first secondary crystallographic direction is of <110> type.

8. The method according to claim 7, wherein the second secondary crystallographic direction is of <100> type.

* * * * *